(12) United States Patent
Qin et al.

(10) Patent No.: US 11,837,608 B2
(45) Date of Patent: Dec. 5, 2023

(54) ARRAY SUBSTRATE AND DISPLAY PANEL

(71) Applicant: KunShan Go-Visionox Opto-Electronics Co., Ltd, Jiangsu (CN)

(72) Inventors: Xu Qin, Kunshan (CN); Miao Chang, Kunshan (CN); Lu Zhang, Kunshan (CN); Siming Hu, Kunshan (CN); Zhenzhen Han, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 24 days.

(21) Appl. No.: 17/714,458

(22) Filed: Apr. 6, 2022

(65) Prior Publication Data
US 2022/0231055 A1 Jul. 21, 2022

Related U.S. Application Data

(63) Continuation of application No. PCT/CN2021/077950, filed on Feb. 25, 2021.

(30) Foreign Application Priority Data

Apr. 15, 2020 (CN) .......................... 202010293405.4

(51) Int. Cl.
 *H01L 27/12* (2006.01)
 *G09G 3/20* (2006.01)
(52) U.S. Cl.
 CPC .............. *H01L 27/124* (2013.01); *G09G 3/20* (2013.01); *G09G 2300/0426* (2013.01); *G09G 2310/08* (2013.01); *G09G 2330/12* (2013.01)
(58) Field of Classification Search
 CPC .............. H01L 27/124; G09G 2310/08; G09G 2330/12; G09G 2310/0297; G09G 2300/0426
 See application file for complete search history.

(56) References Cited

U.S. PATENT DOCUMENTS

| | | | |
|---|---|---|---|
| 9,600,127 B2 | 3/2017 | Hong | |
| 2006/0228972 A1* | 10/2006 | Akiyama | H01J 9/445 445/24 |

(Continued)

FOREIGN PATENT DOCUMENTS

| | | |
|---|---|---|
| CN | 101295081 A | 10/2008 |
| CN | 107203080 A | 9/2017 |

(Continued)

OTHER PUBLICATIONS

The International search report for PCT Application No. PCT/CN2021/077950, dated Jun. 2, 2021, 14 pages.

(Continued)

*Primary Examiner* — Shaheda A Abdin
(74) *Attorney, Agent, or Firm* — Maier & Maier, PLLC

(57) ABSTRACT

An array substrate and a display panel. The array substrate includes: a substrate having a display region and a non-display region surrounding the display region. The non-display region includes a first sub-region extending in a first direction, a second sub-region extending in a second direction, and a third sub-region connecting the first sub-region with the second sub-region, and the third sub-region extends in an arc shape, and the first sub-region comprises a binding region; a plurality of signal lines extending in the display region; a plurality of circuit modules located on the substrate; and a plurality of fan-out lines located in the non-display region. Each of the fan-out lines is electrically connected to a corresponding one of the circuit modules and extends to the binding region.

11 Claims, 7 Drawing Sheets

(56) References Cited

U.S. PATENT DOCUMENTS

| | | | |
|---|---|---|---|
| 2016/0372489 A1* | 12/2016 | Li | H01L 21/76802 |
| 2018/0321539 A1* | 11/2018 | Koide | G06F 3/04164 |
| 2020/0066806 A1* | 2/2020 | Wu | G06F 1/1637 |
| 2020/0175917 A1* | 6/2020 | Jo | G09G 3/20 |

FOREIGN PATENT DOCUMENTS

| | | |
|---|---|---|
| CN | 108376522 A | 8/2018 |
| CN | 109031818 A | 12/2018 |
| CN | 109765737 A | 5/2019 |
| CN | 110265468 A | 9/2019 |
| CN | 111323949 A | 6/2020 |
| IN | 110646965 A | 1/2020 |

OTHER PUBLICATIONS

The First Office Action for Chinese Application No. 202010293405.4, dated Sep. 27, 2021, 14 pages.
The Second Office Action for Chinese Application No. 202010293405.4, dated Mar. 17, 2022, 7 pages.
Office Action dated Jun. 24, 2022 in Chinese Patent Application No. 202010293405.4 (with English translation); 6 pages.

* cited by examiner

ARRAY SUBSTRATE AND DISPLAY PANEL

CROSS-REFERENCE TO RELATED APPLICATION

This application is a continuation of International Application No. PCT/CN2021/077950, filed on Feb. 25, 2021, which claims priority to Chinese Patent Application No. 202010293405.4 entitled "ARRAY SUBSTRATE AND DISPLAY PANEL" and filed on Apr. 15, 2020, both of which are hereby incorporated by reference in their entireties.

TECHNICAL FIELD

The present application relates to a technical field of display, and in particular to an array substrate and a display panel.

BACKGROUND

Flat display panels are widely used in various consumer electronic products such as mobile phones, TVs, personal digital assistants, digital cameras, notebook computers, desktop computers and the like due to their advantages of high image quality, power saving, thin body and wide application range. Therefore, the flat display panels have become the mainstream in display panels.

A flat display panel usually includes an array substrate. The array substrate includes a display region and a non-display region surrounding the display region. The non-display region is provided with a circuit structure for driving pixels of the display panel to display. In order to meet the needs of narrow bezels of electronic products, it is necessary to reasonably set the circuit structure in the non-display region to reduce the area of the non-display region.

SUMMARY

The present application provides an array substrate and a display panel, which can reduce the area of the non-display region, so as to meet the needs of narrow bezels of the display panel.

In an aspect, the embodiments of the present application provide an array substrate, including: a substrate having a display region and a non-display region surrounding the display region, wherein the non-display region includes a first sub-region extending in a first direction, a second sub-region extending in a second direction intersecting the first direction, and a third sub-region connecting the first sub-region with the second sub-region, and the third sub-region extends in an arc shape, and the first sub-region includes a binding region; a plurality of signal lines extending in the display region, wherein each of the signal lines extends along the second direction; a plurality of circuit modules electrically connected to each other and located on the substrate, wherein at least part of the circuit modules are located between the display region and the binding region, each of the circuit modules is electrically connected to at least two of the signal lines, a part of the circuit modules are arranged in the first sub-region along the first direction, and another part of the circuit modules are arranged in an array in the third sub-region along an arc-shaped extending direction of the third sub-region; and a plurality of fan-out lines, wherein each of the fan-out lines is electrically connected to a corresponding one of the circuit modules and extends to the binding region.

In another aspect, the embodiments of the present application further provide a display panel including the array substrate according to any of the embodiments in the above aspect.

According to the array substrate and the display panel in the embodiments of the present application, the array substrate includes the substrate, the plurality of signal lines, the plurality of circuit modules electrically connected to each other and the plurality of fan-out lines. Since each of the circuit modules is electrically connected to at least two of the signal lines, and each of the circuit modules is electrically connected to the binding region via one fan-out line, the at least two of the signal lines are connected to the binding region via one fan-out line. Therefore, the number of wirings in the non-display region is effectively reduced, and thus the area of the non-display region is reduced. Further, since a part of the circuit modules are arranged in an array in the third sub-region along the arc-shaped extending direction of the third sub-region, the arrangement of the plurality of circuit modules is more compact. Meanwhile, the part of the circuit modules arranged in the array are more matched with the third sub-region of the arc shape. Therefore, the space of the third sub-region is effectively reduced. Compared with arranging the circuit modules in the third sub-region in a straight line or along the edge of the third sub-region in a step form, the area of the third sub-region is effectively reduced, and thus the area of the bezel of the display panel is effectively reduced.

BRIEF DESCRIPTION OF THE DRAWINGS

Other features, objects, and advantages of the present application will become more apparent from the following detailed description of non-limiting embodiments with reference to the accompanying drawings, in which like or similar reference characters refer to the same or similar features, and the drawings are not necessarily drawn to scale.

DETAILED DESCRIPTION

Figure 1:
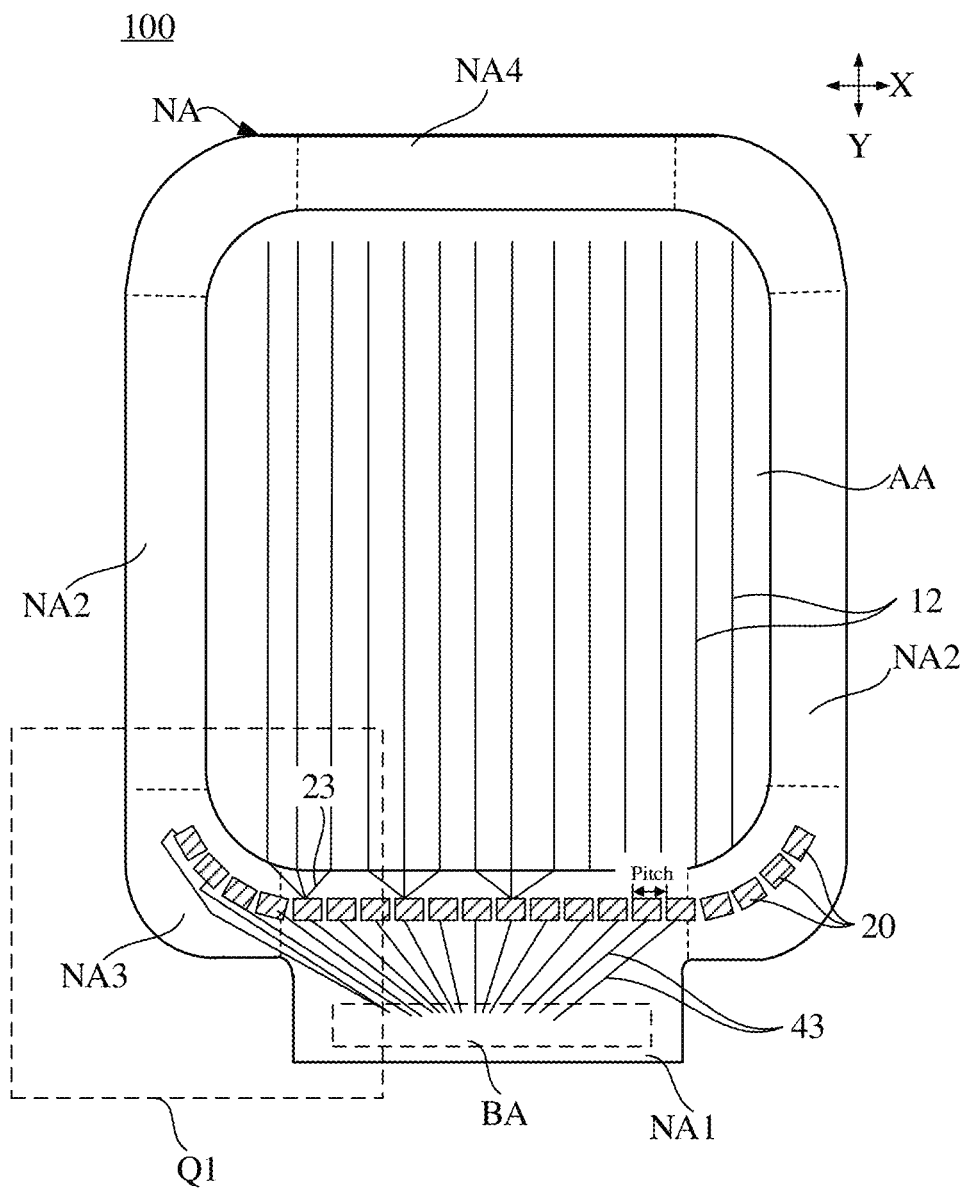
FIG. 1 is a top view of an array substrate according to an embodiment of the present application.

Features and exemplary embodiments of various aspects of the present application are described in detail below. In the following detailed description, numerous specific details are set forth in order to provide a thorough understanding of the present application. The following description of the embodiments is merely intended to provide a better understanding of the application by illustrating examples of the present application. In the drawings and the following description, at least some well-known structures and techniques have not been shown in order to avoid unnecessarily obscuring of the present application. In addition, the dimensions of some of the structures may be exaggerated for clarity. Furthermore, the features, structures, or characteristics described below may be combined in any suitable manner in one or more embodiments.

With respect to electronic devices such as mobile phones and tablets, users are increasingly demanding narrow bezels. Since more circuit structures (such as integrated circuits (IC), demultiplexers and the like) are arranged in the lower bezel of the display panel, in order to further reduce the area of the lower bezel, a part of the circuit structures (such as a part of the demultiplexers) originally arranged at the lower bezel are usually arranged at the junction of the lower bezel and the side bezel.

The junction of the lower bezel and the side bezel of the display panel is an arc bezel. In order to reduce the width of the lower bezel, a part of the circuit structures are usually arranged at the arc bezel. Under a condition that the arrangement of the circuit structures is not properly set, the area of the arc bezel will be larger.

In order to solve the above problems, the embodiments of the present application provide an array substrate 100 and a display panel. The array substrate 100 and the display panel according to the embodiments of the present application will be described in detail with reference to FIG. 1 to FIG. 9.

Figure 2:
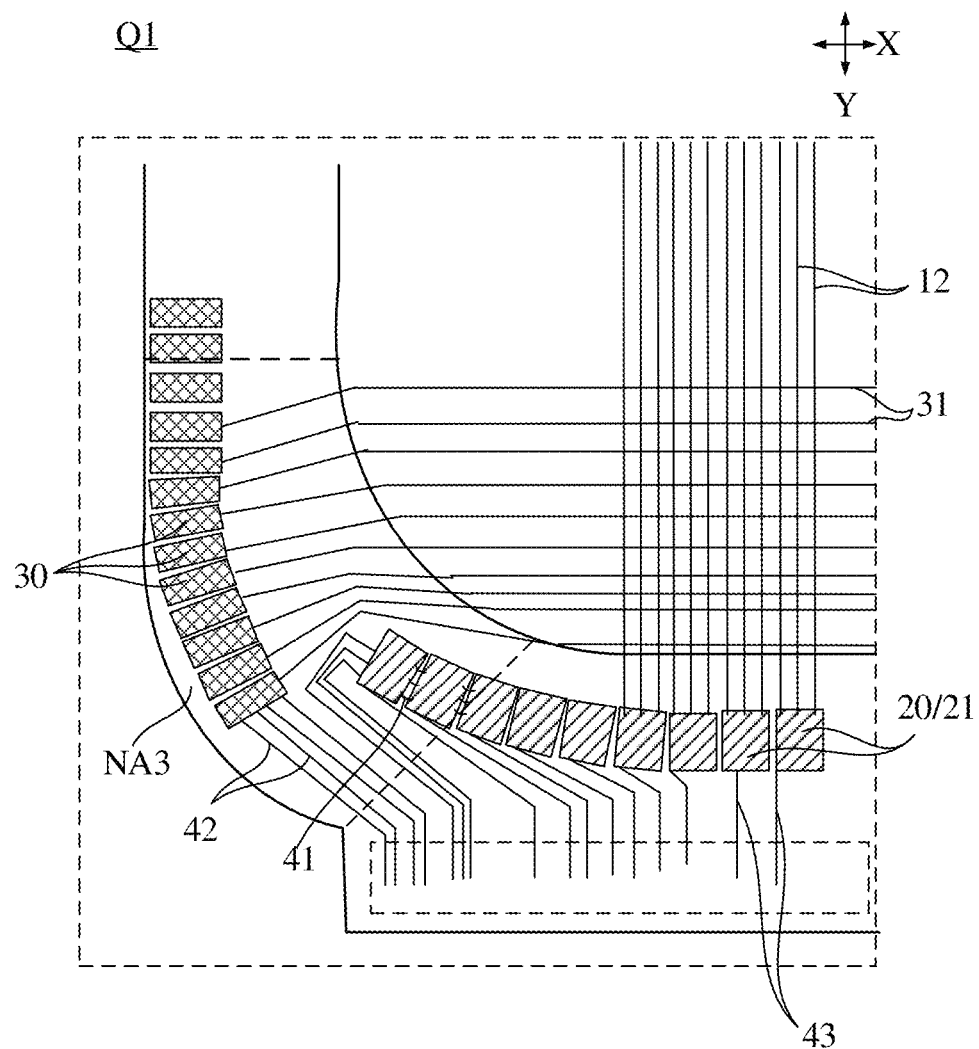
FIG. 2 is an enlarged view of a region Q1 of an example array substrate provided in FIG. 1.
Figure 3:
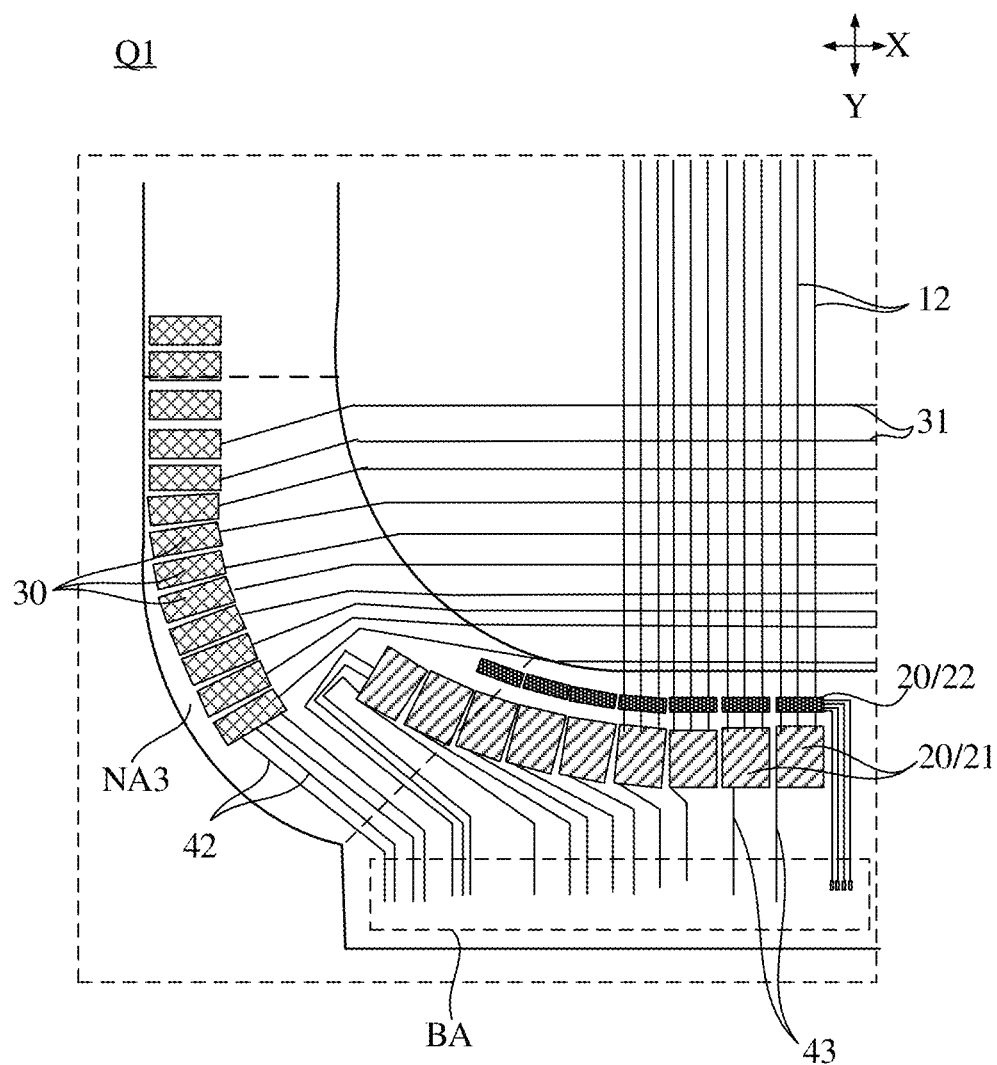
FIG. 3 is an enlarged view of a region Q1 of another example array substrate provided in FIG. 1.

FIG. 1 is a top view of an array substrate according to an embodiment of the present application; FIG. 2 is an enlarged view of a region Q1 of an example array substrate provided in FIG. 1; and FIG. 3 is an enlarged view of a region Q1 of another example array substrate provided in FIG. 1. In FIGS. 1 to 3, only a part of the connection relationships between the signal lines, the circuit modules and the fan-out lines are schematically shown.

The accompanying drawings show a form of the array substrate 100 according to the embodiments of the present application, however, the array substrate 100 of the embodiments of the present application may be presented in various forms, and some examples thereof will be described below.

As shown in FIG. 1, the array substrate 100 includes a substrate, a plurality of signal lines 12, a plurality of circuit modules 20 electrically connected to each other, and a plurality of fan-out lines 43.

The substrate may be rigid, such as a glass substrate, or flexible, such as a polyimide (PI) substrate. The substrate has a display region AA and a non-display region NA surrounding the display region AA. The non-display region NA includes a first sub-region NA1 extending in a first direction X, a second sub-region NA2 extending in a second direction Y intersecting the first direction X (in this embodiment, the second direction Y is perpendicular to the first direction X), and a third sub-region NA3 connecting the first sub-region NA1 with the second sub-region NA2, and the third sub-region NA3 extends in an arc shape, and the first sub-region NA1 includes a binding region BA. Here, the center of circle where the arc shape of the third sub-region NA3 is located is located on a side of the third sub-region NA3 close to the display region AA.

Further, the non-display region NA may further include a fourth sub-region NA4, which is located on the opposite side of the first sub-region NA1 along the second direction Y.

There may be two second sub-regions NA2, which are respectively located on both sides of the display region AA along the first direction X.

The plurality of signal lines 12 extend in the display region AA, and each of the signal lines 12 extends along the second direction Y. The plurality of circuit modules 20 electrically connected to each other are located on the substrate, wherein at least part of the circuit modules 20 are located between the display region AA and the binding region BA. Each of the circuit modules 20 is electrically connected to at least two of the signal lines 12. A part of the circuit modules 20 are arranged in the first sub-region NA1 along the first direction X, and another part of the circuit modules 20 are arranged in an array in the third sub-region NA3 along an extending direction of the third sub-region NA3 of the arc shape. Each of the fan-out lines 43 is electrically connected to a corresponding one of the circuit modules 20 and extends to the binding region BA. Here, the non-display region NA may also include a fan-out region located between the binding region BA and the display region AA, and the fan-out lines 43 extend in the fan-out region.

It can be understood that the part of the circuit modules 20 being arranged in an array in the third sub-region NA3 along the extending direction of the third sub-region NA3 of the arc shape means that each circuit module 20 in the part of the circuit modules 20 is arranged at a predetermined rotated angle, so that the part of the circuit modules 20 can be arrayed along the extending direction of the third sub-region NA3 of the arc shape as a whole.

Although not shown in the figure, in some embodiments, the array substrate 100 includes a plurality of pixel circuits arranged in an array in the display region AA, and each of the pixel circuits is used to drive a corresponding sub-pixel to display. The pixel circuits can be arranged in a plurality of rows and a plurality of columns. The plurality of signal lines 12 include a plurality of data lines. Each of the data lines extends in a column direction of the pixel circuit arrangement in the display region AA, and a plurality of data lines are arranged in a row direction of the pixel circuit arrangement in the display region AA. In this embodiment, the description is made by taking the plurality of signal lines 12 including a plurality of data lines as an example.

In some embodiments, the binding region BA is located on a side of the display region AA along the second direction Y, and the binding region BA extends along the first direction X. In some embodiments, the first direction X is parallel to the row direction of the aforementioned pixel circuit arrangement, and the second direction Y is parallel to the column direction of the aforementioned pixel circuit arrangement.

According to the array substrate 100 in the embodiments of the present application, each of the circuit modules 20 is electrically connected to the binding region BA via one fan-out line 43, so that at least two of the signal lines 12 are connected to the binding region BA via one fan-out line 43. Therefore, the number of wirings in the non-display region NA is effectively reduced, and thus the area of the non-display region NA is reduced. Further, since a part of the circuit modules 20 are arranged in an array in the third sub-region NA3 along the extending direction of the third sub-region NA3 of the arc shape, the arrangement of the plurality of circuit modules 20 is more compact. Meanwhile, the part of the circuit modules 20 arranged in the array are more matched with the third sub-region NA3 of the arc shape. Therefore, the space of the third sub-region NA3 is effectively reduced, and thus the area of the bezel at the third sub-region NA3 is effectively reduced.

In some embodiments, the circuit modules 20 located in the first sub-region NA1 are adjacent to the circuit modules 20 located in the third sub-region NA3. With the above arrangement, on the one hand, the circuit environments of the circuit modules 20 located in the first sub-region NA1 and the circuit environments of the circuit modules 20 located in the third sub-region NA3 are similar, which can improve the uniformity of the electrical signals in the circuit modules 20. On the other hand, compared with an arrangement that there is a gap between the circuit modules 20 in the first sub-region NA1 and the circuit modules 20 in the third sub-region NA3, by arranging the circuit modules 20 in the third sub-region sub-regions NA3 adjacent to the circuit modules 20 in the first sub-region NA1, the area of the third sub-region NA3 can be effectively reduced. In particular, the width of the third sub-region NA3 in the radial direction can be reduced, thereby meeting the requirement of narrow bezels.

In order to reduce the bezel, it is also necessary to reasonably set the pitch between adjacent circuit modules 20, so as to make the circuit environment of each circuit module 20 and the circuit environment of the corresponding adjacent circuit module 20 be consistent. In order to solve the above problems, in some embodiments, each of the circuit modules 20 includes a first side and a second side. A pitch between first sides of two adjacent circuit modules 20 located in the first sub-region NA1 is the same as a pitch between first sides of two adjacent circuit modules 20 located in the third sub-region NA3. Here, as shown in FIG. 1, the pitch between adjacent circuit modules 20 refers to a distance between two points located at the same position on two adjacent circuit modules 20. With the above arrangement, the circuit environments of the circuit modules 20 located in the first sub-region NA1 and the circuit environments of the circuit module 20 located in the third sub-region NA3 are similar. Therefore, the uniformity and stability of the electrical signals in the circuit modules 20 can be improved, thereby improving the quality of the array substrate 100.

Please continue to refer to FIG. 2. In some embodiments, the array substrate 100 further includes a plurality of control lines 41. The control lines 41 are configured to control conduction between the fan-out lines 43 and the corresponding signal lines 12. In the third sub-region NA3, the control lines 41 connected between adjacent ones of the circuit modules 20 extend in an arc shape. Compared with the control lines arranged in a step shape or a broken line shape when the circuit modules 20 are arranged in the third sub-region NA3 in a step form, by setting the control lines 41 between the adjacent circuit modules 20 in the third sub-region NA3 in an arc shape, the array substrate 100 provided by the embodiments of the present application can reduce the length of the control lines 41, and can reduce the impedance of the signals transmitting on the control lines 41, and at the same time can further reduce the width of the bezel of the third sub-region NA3. Here, the width of the bezel of the third sub-region NA3 refers to the width of the third sub-region NA3 in the radial direction.

In some embodiments, the array substrate 100 further includes an integrated circuit (IC) chip and a flexible printed circuit (FPC), and the IC chip may be disposed in the binding region BA through the FPC.

In order to enable the pixels located in the display region AA to display by emitting light, the array substrate 100 further includes a plurality of driving circuits 30. The driving circuits 30 are disposed on the substrate and located in the non-display region NA. In addition, the driving circuits 30 are located on at least one side of the display region AA along the first direction X. Further, a part of the driving circuits 30 are arranged in the second sub-region NA2 along the second direction Y, and another part of the driving circuits 30 are arranged in an array in the third sub-region NA3 along the extending direction of the third sub-region NA3 of the arc shape. By reasonably setting the arrangement of the driving circuits 30 in the non-display region NA, the driving circuits 30 can stably drive the pixels to display by emitting light, and the area of the bezel of the third sub-region NA3 can be reduced.

Particularly, the driving circuits 30 may include a plurality of first driving circuits and a plurality of second driving circuits respectively disposed on two sides of the display region AA along the first direction X. In this embodiment, the first driving circuits and the second driving circuits are gate driving circuits. Each gate driving circuit includes a plurality of shift registers connected in a cascade manner. Each row of pixel circuits are connected to a gate driving circuit through a corresponding scan line 31. The gate driving circuits can gate the pixel circuits row by row (i.e., row by row scan) through the scan lines 31, so as to drive each row of pixels to display. In some embodiments, the driving circuits are, for example, amorphous silicon gate (ASG) driving circuits. By reasonably setting the structure of the driving circuits, the number of wirings in the non-display region NA can be simplified, thereby effectively reducing the width of the non-display region NA, such as the width of the second sub-region NA2 and the width of the third sub-region NA3.

The driving circuits 30 and a part of the circuit modules 20 are arranged in the third sub-region NA3 at the same time, and the array substrate 100 further includes a plurality of scan lines 31. The scan lines 31 extend in the display region AA along the first direction X, and the scan lines 31 are electrically connected to corresponding driving circuits 30. The circuit modules 20 are electrically connected to the signal lines 12 (data lines) extending along the second direction Y. In order to prevent the scan lines 31 and the data lines from being complicatedly wound, as shown in FIGS. 2 and 3, in some embodiments, in the third sub-region NA3, the circuit modules 20 are located between the driving circuits 30 and the display region AA. With the above arrangement, the signal lines 12 electrically connected to the circuit modules 20 and the scan lines 31 electrically connected to the drive circuits 30 are arranged to give way to each other. Therefore, the complicated winding of the scan lines 31 and the data signal lines 12 can be effectively avoided, and an increase of the impedance caused by the complicated winding and the interference between the scan lines 31 and the signal lines 12 can be effectively reduced.

In order to control the driving circuits 30, in some embodiments, the array substrate 100 further includes a plurality of signal buses 42 disposed on the substrate, and the plurality of signal buses 42 are electrically connected to the driving circuits 30 and extend to the binding region BA. In a thickness direction of the array substrate 100, an orthographic projection of the plurality of signal buses 42 and an orthographic projection of the plurality of fan-out lines 43 are not overlapped. With the above arrangement, the plurality of signal buses 42 and the plurality of fan-out lines 43 can make use of the space of the third sub-region NA3 reasonably, and at the same time, there is no interference between the signal buses 42 and the fan-out lines 43.

Next, the signal buses 42 will be introduced. The signals provided by the signal buses 42 are signals including complete waveforms of high potential signals, low potential signals, and AC signals, and are necessary signals for operating the driving circuits 30. The driving circuits 30 of this embodiment are gate driving circuits. Here, according to different types of transmission signals, the signal buses 42 may include clock signal lines, initial signal lines, transistor turn-off signal lines, first scanning direction signal lines, second scanning direction signal lines and the like. The clock signal lines are used to provide clock signals. The initial signal lines are used to provide initial signals for the gate driving circuits to start progressive scanning. The transistor turn-off signal lines are used to provide turn-off signals for preset transistors in the shift registers. The first scanning direction signal lines and the second scanning direction signal lines are respectively used to provide scanning direction signals. For example, when the first scanning direction signal lines provide first scanning direction signals, the progressive scanning direction of the driving circuits 30 is from the end far away from the binding region BA to the end close to the binding region BA. When the second scanning direction signal lines provide second scanning direction signals, the progressive scanning direction of the driving circuits 30 is from the end close to the binding region BA to the end far away from the binding region BA.

As shown in FIGS. 2 and 3, the scan lines 31 electrically connected to the driving circuits 30 extend to the display region AA along the first direction X, and the scan lines 31 are used to gate the pixel structures. Nevertheless, a part of the circuit modules 20 are arranged in an array in the third sub-region NA3. Under a condition that the height of the circuit modules 20 in the second direction Y is too large, the scan lines 31 electrically connected to the driving circuits 30 will need to bypass the circuit modules 20. Therefore, in order to prevent the circuit modules 20 from affecting the wiring of the driving circuits 30, in the radial direction of the third sub-region NA3, the driving circuits 30 and the circuit modules 20 are not overlapped. With the above arrangement, in the radial direction of the third sub-region NA3, there is no overlap at the junction of the driving circuits 30 and the circuit modules 20, thereby ensuring the space for the wiring of the scan lines 31.

Figure 4:
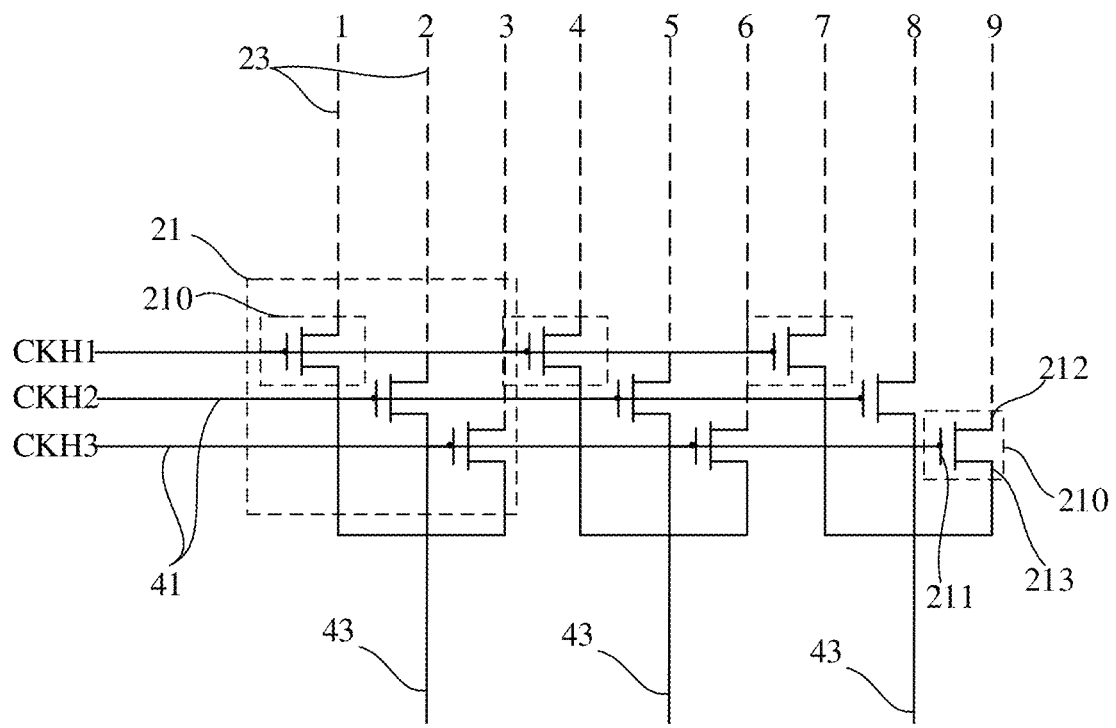
FIG. 4 is a schematic diagram of an equivalent circuit of a demultiplexer according to an embodiment of the present application.
Figure 5:
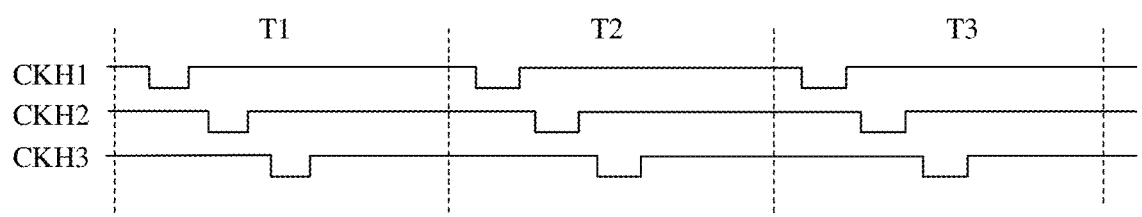
FIG. 5 is a timing diagram of the equivalent circuit provided in FIG. 4.
Figure 6:
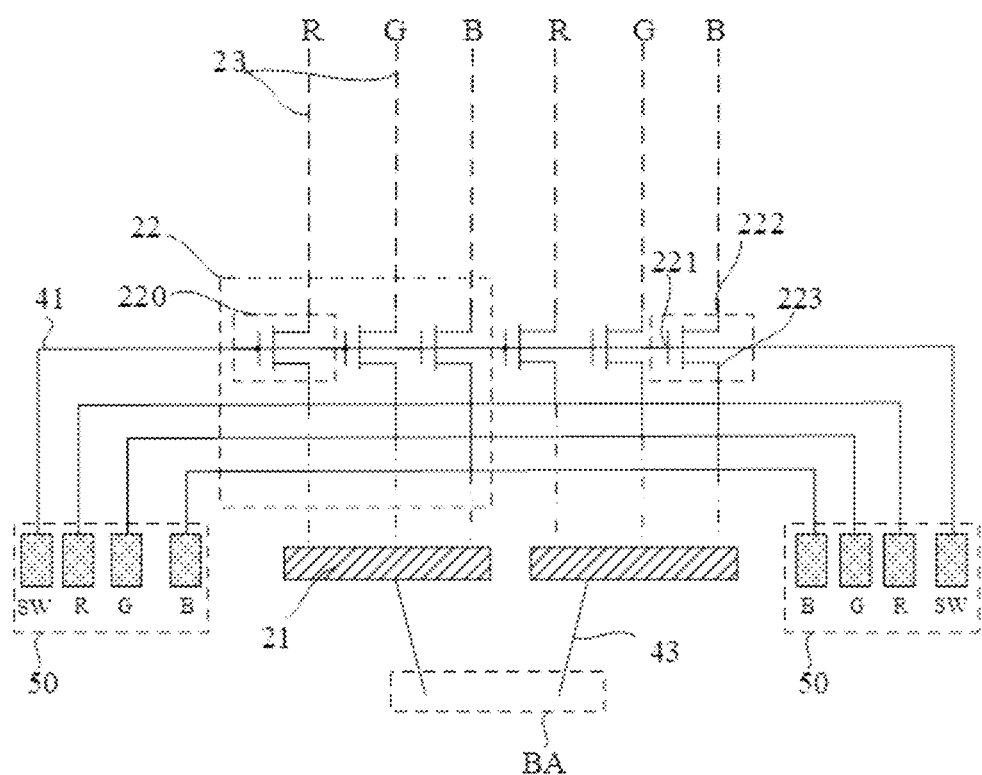
FIG. 6 is a schematic diagram of an equivalent circuit of a detection circuit according to an embodiment of the present application.

Please further refer to FIGS. 4 to 6. FIG. 4 is a schematic diagram of an equivalent circuit of an example demultiplexer according to an embodiment of the present application; FIG. 5 is a timing diagram of the equivalent circuit provided in FIG. 4; and FIG. 6 is a schematic diagram of an equivalent circuit of an example detection circuit according to an embodiment of the present application. In some embodiments, the array substrate 100 further includes a plurality of control lines 41 configured to control conductions between the fan-out lines 43 and the corresponding signal lines 12. Each of the circuit modules 20 includes a demultiplexer (Demux) 21. The demultiplexer 21 includes two or more first transistors 210. Each of the first transistors 210 includes a first gate 211, a first electrode 212, and a second electrode 213. In one demultiplexer 21, the first gates 211 of the first transistors 210 are respectively electrically connected to the control lines 41, the first electrodes 212 of the first transistors 210 are respectively electrically connected to the corresponding signal lines 12 through the connecting lines 23, and the second electrodes 213 of the first transistors 210 extend to the binding region BA through a same fan-out line 43. And/or, each of the circuit modules 20 includes a detection module 22. The detection module 22 includes two or more second transistors 220. Each of the second transistors 220 includes a second gate 221, a third electrode 222, and a fourth electrode 223. In the detection module 22, the second gates 221 of the second transistors 220 are respectively electrically connected to the control lines 41, the third electrodes 222 of the second transistors 220 are respectively electrically connected to the corresponding signal lines 12 of a same signal type through the connecting lines 23, and the fourth electrodes 223 of the second transistors 220 extend to the binding region BA through the fan-out line 43. It can be understood that the binding region BA may also be provided with a plurality of binding terminals 50, and the fourth electrodes 223 of the second transistors 220 are used to respectively electrically connect signal lines 12 of a same signal type to the corresponding binding terminals 50 through a conductive line, such as a fan-out line 43.

Here, the detection module 22 includes a cell test (CT) module. Each of the circuit modules 20 may include a demultiplexer 21 and a CT module, and the CT module may be arranged on a side of the demultiplexer 21 close to the display region AA. The demultiplexer is configured to electrically connect two or more signal lines 12 to a corresponding fan-out line 43 through a connecting line 23, thereby reducing the number of wirings located in the non-display region NA, and reducing the area of the non-display region NA (i.e., the area of the bezel). The CT module is configured to perform a cell test on the display panel, mainly by electrically connecting two or more signal lines 12 of a same signal type to a corresponding binding terminal 50, thereby driving the pixels of a same type to display by emitting light. The signal lines 12 of a same signal type refer to signal lines 12 which drive the pixels of a same color to display by emitting light. For example, the signal lines 12 of a same signal type refer to signal lines 12 which drive the red light-emitting pixels to display by emitting light. By controlling the CT module, it is possible to drive the red light-emitting pixels, or the green light-emitting pixels, or the blue light-emitting pixels of the display panel to display, so as to detect monochrome images of the display panel.

In some embodiments, as shown in FIG. 6, the detection module 22 is located above the demultiplexer 21, that is, the detection module 22 is located on a side of the demultiplexer 21 close to the display region AA, which is convenient for simplifying the wiring structure. Here, the third electrodes 222 of the second transistors 220 in the detection module 22 are respectively electrically connected to the corresponding signal lines 12 of a same signal type. For example, as shown in FIG. 6, each detection module 22 may include three second transistors 220, the third electrode 222 of one second transistor 220 is electrically connected to a signal line 12 for driving red pixels, the third electrode 222 of one second transistor 220 is electrically connected to a signal line 12 for driving green pixels, and the third electrode 222 of one second transistor 220 is electrically connected to a signal line 12 for driving blue pixels. In order to realize the cell test, the fourth electrode 223 of the second transistor 220 is electrically connected to a corresponding binding terminal 50 through a fan-out line 43. In a same second transistor 220, the signal line 12 connected to the third electrode 222 has a same signal type as the binding terminal 50. Specifically, the signal line 12 connected to the third electrode 222 and the binding terminal 50 are both used to drive the pixels of a same color to display by emitting light.

In a specific implementation, the fourth electrodes 223 of the plurality of second transistors 220 electrically connected to the signal lines 12 corresponding to the red sub-pixels can be connected to the binding terminals 50 which drive the red pixels to display by emitting light. The fourth electrodes 223 of the plurality of second transistors 220 electrically connected to the signal lines 12 corresponding to the green sub-pixels can be connected to the binding terminals 50 which drive the green pixels to display by emitting light. The fourth electrodes 223 of the plurality of second transistors 220 electrically connected to the signal lines 12 corresponding to the blue sub-pixels can be connected to the binding terminals 50 which drive the blue pixels to display by emitting light. Under a condition that the circuit module 20 includes the demultiplexer 21 and the CT module, the fourth electrodes 223 of the above-mentioned second transistors 220 are connected to two branches respectively. In the first branch, the fourth electrodes 223 extend to the binding region BA through the conductive lines and are electrically connected to the corresponding binding terminals R. In the second branch, the fourth electrodes 223 extend to the demultiplexer 21, and the fourth electrodes 223 extend to the binding region BA through a fan-out line 43 and are electrically connected to a corresponding IC chip or a flexible circuit board. Similarly, the binding region BA is also provided with corresponding binding terminals R, binding terminals G, binding terminals B, and binding terminals SW. The binding terminals R are connected to the signal lines 12 which drive the red pixels (R pixels). The binding terminals G are connected to the signal lines 12 which drive the green pixels (G pixels). The binding terminals B are connected to the signal lines 12 which drive the blue pixels (B pixels). The binding terminals SW are electrically connected to the control lines 41 in the detection modules 22. By controlling the input electrical signals of the binding terminals SW and the binding terminals G, the display of a green image of the display panel may be realized. Similarly, by controlling the input electrical signals of the binding terminals SW and the binding terminals R, the display of a red image of the display panel may be realized, and by controlling the input electrical signals of the binding terminals SW and the binding terminals B, the display of a blue image of the display panel may be realized.

Since the way that the CT modules control the sub-pixels to display by emitting light via the signal lines 12 is similar to the way that the demultiplexers 21 control the sub-pixels to display by emitting light via the signal lines 12, the present application takes the demultiplexers 21 as an example for description.

In some embodiments, the demultiplexer 21 includes two or more first switching transistors and connecting lines 23. In one demultiplexer 21, the first electrodes 212 of the first switching transistors are electrically connected to corresponding data lines through respective connecting lines 23. The second electrodes 213 of the first switching transistors are connected to an IC chip through a same fan-out line 43. The first gates 211 of the first switching transistors are electrically connected to corresponding control lines 41. The control lines 41 can provide a clock signal or a pulse signal. Optionally, the control line 41 can be a clock signal line. The function and the working process of the demultiplexer 21 will be described below in conjunction with FIGS. 4 and 5.

In this embodiment, a 1:3 Demux is taken as an example. Here, 1:3 indicates that one fan-out line 43 is electrically connected to three data lines through one Demux, and one Demux circuit provides data signals to the three data lines in a time-sharing manner. There are three clock signals in the 1:3 Demux, which are a first clock signal CKH1, a second clock signal CKH2, and a third clock signal CKH3. The first gate 211 of the first transistor 210 corresponding to the 3m−1$^{th}$ data line may correspond to a same clock signal. The first gate 211 of the first transistor 210 corresponding to the 3m−2$^{th}$ data line may correspond to a same clock signal. The first gate 211 of the first transistor 210 corresponding to the 3 m$^{th}$ data line may correspond to a same clock signal. Here, m is an integer greater than or equal to 1. In this way, the entire demultiplexers 21 only need three clock signals.

Taking FIG. 4 as an example, the first transistors 210 connected to the first, fourth, and seventh data lines may correspond to the first clock signal CKH1. The first transistors 210 connected to the second, fifth, and eighth data lines may correspond to the second clock signal CKH2. The first transistors 210 connected to the third, sixth, and ninth data lines may correspond to the third clock signal CKH3. Please refer to the timing diagram of FIG. 5, taking the PMOS transistor as an example, the first transistor 210 is turned on when the clock signal is low. In the T1 phase, when the first clock signal CKH1 is at a low level, CKH2 and CKH3 are both at a high level. The switching transistors corresponding to CKH1 are turned on. The data signals are transmitted through the fan-out lines 43 into the connecting lines 23 corresponding to the transistors connected to CKH1, and are input into the corresponding signal lines 12 through the connecting lines 23. Similarly, when the second clock signal CKH2 is at a low level, CKH1 and CKH3 are both at a high level. The switching transistors corresponding to CKH2 are turned on. The data signals are transmitted through the fan-out lines 43 into the connecting lines 23 corresponding to the switching transistors connected to CKH2, and are input into the corresponding data lines through the connecting lines 23. When the third clock signal CKH3 is at a low level, CKH2 and CKH1 are both at a high level. The switching transistors corresponding to CKH3 are turned on. The data signals are transmitted through the fan-out lines 43 into the connecting lines 23 corresponding to the switching transistors connected to CKH3, and are input into the corresponding data lines through the connecting lines 23. Therefore, this embodiment can reduce the area occupied by the fan-out lines 43 by only effectively reducing the number of data lines connected to the binding region BA. Further, the width occupied by the third sub-region NA3 is effectively compressed, thereby implementing the technical effect of narrow bezels.

In order to further illustrate the technical effects that the array substrate 100 of the embodiments of the present application can provide narrow bezels and especially reduce the width of the arc-shaped third sub-region NA3, the embodiments of the present application introduce a comparative example for description.

Figure 7:
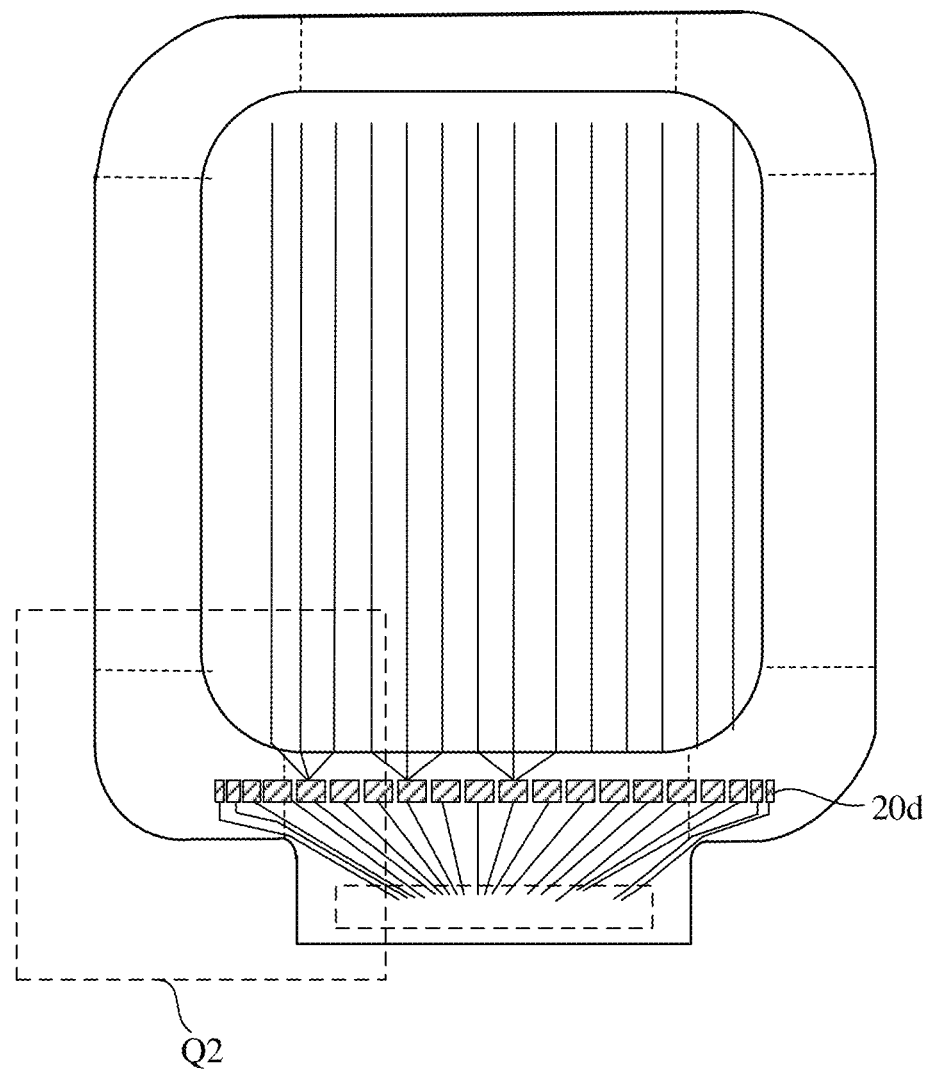
FIG. 7 is a top view of an array substrate according to a comparative example.
Figure 8:
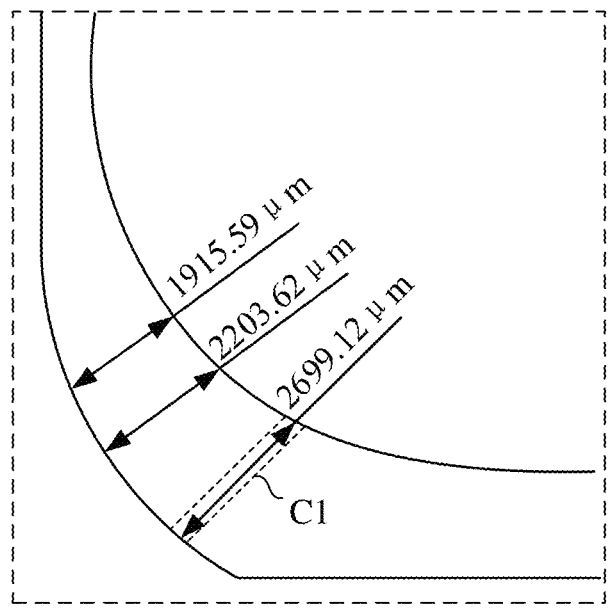
FIG. 8 is an enlarged view of a region Q2 in FIG. 7, showing partial dimensions of a third sub-region.
Figure 9:
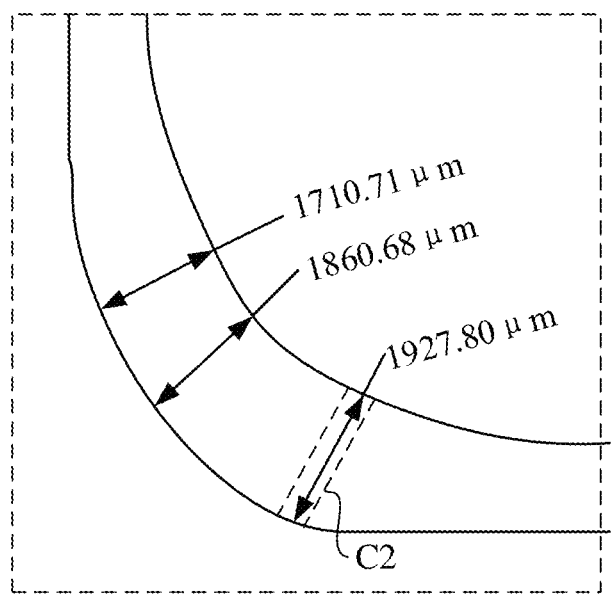
FIG. 9 is a structural diagram of a third sub-region of an array substrate according to an embodiment of the present application, showing partial dimensions of the third sub-region.

Please refer to FIGS. 7 to 9 together. FIG. 7 is a top view of an array substrate according to a comparative example. FIG. 8 is an enlarged view of a region Q2 in FIG. 7, showing partial dimensions of a third sub-region. FIG. 9 is a structural diagram of a third sub-region of an array substrate according to an embodiment of the present application, showing partial dimensions of the third sub-region. In the comparative example, a part of the circuit modules 20*d* are located at the arc bezel, and are arranged in an array along the first direction X. Further, in the comparative example, in the direction away from the display region AA along the first direction X, the pitches between adjacent circuit modules 20*d* located at the arc bezel decrease. At this time, the arc bezel at C1 in the comparative example is a bezel formed due to the influence of the circuit modules 20*d*, and the width of the arc bezel along the radial direction at C1 is 2699.12 microns.

In the embodiments of the present application, the third sub-region NA3 at C2 is a bezel formed due to the influence of the circuit modules 20, and the width of the third sub-region NA3 in the radial direction at C2 is 1927.80 microns. Therefore, compared with the comparative example in which the circuit modules 20d are arranged in an array along the first direction X, the circuit modules 20 of the embodiments of the present application can reduce the width of the third sub-region NA3 in the radial direction by about 770 microns. Thus, the arc-shaped transition of the edge of the third sub-region NA3 close to the display region AA is more uniform and beautiful.

In summary, according to the array substrate 100 in the embodiments of the present application, the array substrate 100 includes the substrate, the plurality of signal lines 12, the plurality of circuit modules 20 electrically connected to each other and the plurality of fan-out lines 43. Since each of the circuit modules 20 is electrically connected to at least two of the signal lines 12, and each of the circuit modules 20 is electrically connected to the binding region BA via one fan-out line 43, the at least two of the signal lines 12 are connected to the binding region BA via one fan-out line 43. Therefore, the number of wirings in the non-display region NA is effectively reduced, and thus the area of the non-display region NA is reduced. Further, since a part of the circuit modules 20 are arranged in an array in the third sub-region NA3 along the extending direction of the third sub-region NA3 of the arc shape, the arrangement of the plurality of circuit modules 20 is more compact. Meanwhile, the part of the circuit modules 20 arranged in the array are more matched with the third sub-region NA3 of the arc shape. Therefore, the space of the third sub-region NA3 is effectively reduced. Compared with arranging the circuit modules 20 in the third sub-region NA3 in a straight line or along the edge of the third sub-region NA3 in a step form, the area of the third sub-region NA3 is effectively reduced, and thus the area of the bezel of the display panel is effectively reduced.

The embodiments of the present application also provide a display panel. The display panel may be a liquid crystal display (LCD), an organic light emitting diode (OLED) display panel, a display panel utilizing light emitting diode (LED) devices and the like. Here, the display panel includes the array substrate 100 according to any one of the foregoing embodiments.

According to the display panel in the embodiments of the present application, at least two of the signal lines 12 are connected to the binding region BA via one fan-out line 43. Therefore, the number of wirings in the non-display region NA is effectively reduced, and thus the area of the non-display region NA is reduced. Further, since a part of the circuit modules 20 are arranged in an array in the third sub-region NA3 along the extending direction of the third sub-region NA3 of the arc shape, the arrangement of the plurality of circuit modules 20 is more compact. Meanwhile, the part of the circuit modules 20 arranged in the array are more matched with the third sub-region NA3 of the arc shape. Therefore, the space of the third sub-region NA3 is effectively reduced, and thus the area of the bezel is effectively reduced, which is easy to promote and apply.

The present application may be implemented in other specific forms without departing from its gist or essential characteristics. The present embodiments are therefore to be considered in all respects as illustrative and not restrictive, the scope of the application being indicated by the appended claims rather than by the foregoing description, and all changes which come within the meaning and range of equivalency of the claims are therefore intended to be embraced therein. Furthermore, different technical features presented in different embodiments may be combined to achieve advantageous effects. Those skilled in the art should be able to understand and implement other modified embodiments of the disclosed embodiments on the basis of studying the drawings, the description, and the claims.

What is claimed is:

1. An array substrate, comprising:
   a substrate having a display region and a non-display region surrounding the display region, the non-display region comprising a first sub-region extending in a first direction, a second sub-region extending in a second direction intersecting with the first direction, and a third sub-region connecting the first sub-region with the second sub-region, and the third sub-region extending in an arc shape, and the first sub-region comprising a binding region;
   a plurality of signal lines extending in the display region, each of the signal lines extending along the second direction;
   a plurality of circuit modules located on the substrate, wherein at least part of the circuit modules are located between the display region and the binding region, each of the circuit modules is electrically connected to at least two of the signal lines, a part of the circuit modules are arranged in the first sub-region along the first direction, and another part of the circuit modules are arranged in an array in the third sub-region along an arc-shaped extending direction of the third sub-region;
   a plurality of fan-out lines located in the non-display region, wherein each of the fan-out lines is electrically connected to a corresponding one of the circuit modules and extends to the binding region, and
   a plurality of control lines configured to control conductions between the fan-out lines and corresponding signal lines, wherein:
   each of the circuit modules comprises a demultiplexer, the demultiplexer comprises two or more first transistors, each of the first transistors comprises a first gate, a first electrode and a second electrode, and in the demultiplexer, the first gates of the first transistors are respectively electrically connected to the control lines, the first electrodes of the first transistors are respectively electrically connected to the corresponding signal lines, and the second electrodes of the first transistors extend to the binding region through a same fan-out line, and/or
   each of the circuit modules comprises a detection module, the detection module comprises two or more second transistors, each of the second transistors comprises a second gate, a third electrode and a fourth electrode, and in the detection module, the second gates of the second transistors are respectively electrically connected to the control lines, the third electrodes of the second transistors are respectively electrically connected to the corresponding signal lines of a same signal type, and the fourth electrodes of the second transistors extend to the binding region through the fan-out line.

2. The array substrate according to claim 1, wherein the circuit modules located in the first sub-region are adjacent to the circuit modules located in the third sub-region.

3. The array substrate according to claim 1, wherein each of the circuit modules comprises a first side, and a pitch between two first sides of two adjacent circuit modules located in the first sub-region is the same as a pitch between two first sides of two adjacent circuit modules located in the third sub-region.

4. The array substrate according to claim 1, further comprising:
wherein in the third sub-region, the control lines connected between adjacent ones of the circuit modules extend in an arc shape.

5. The array substrate according to claim 1, further comprising:
a plurality of driving circuits disposed on the substrate, wherein the driving circuits are located in the non-display region and are located on at least one side of the display region along the first direction, and a part of the driving circuits are arranged in the second sub-region along the second direction, and another part of the driving circuits are arranged in an array in the third sub-region along the arc-shaped extending direction of the third sub-region.

6. The array substrate according to claim 5, wherein in the third sub-region, the circuit modules are located between the driving circuits and the display region.

7. The array substrate according to claim 5, further comprising:
a plurality of signal buses disposed on the substrate, wherein the plurality of signal buses are electrically connected to the driving circuits and extend to the binding region, and
in a thickness direction of the array substrate, an orthographic projection of the plurality of signal buses and an orthographic projection of the plurality of fan-out lines are not overlapped.

8. The array substrate according to claim 5, wherein in a radial direction of the third sub-region of the arc shape, the driving circuits and the circuit modules are not overlapped.

9. The array substrate according to claim 1, wherein each of the circuit modules comprises the demultiplexer and the detection module, and the detection module is located on a side of the demultiplexer close to the display region.

10. The array substrate according to claim 1, wherein each of the circuit modules comprises the detection module, and the array substrate further comprises:
a plurality of binding terminals located in the binding region,
wherein in a same second transistor, the fourth electrode is electrically connected to a corresponding binding terminal through the fan-out line, and the signal line connected to the third electrode has a same signal type as the binding terminal.

11. A display panel comprising the array substrate according to claim 1.

* * * * *